United States Patent
Bellows

(10) Patent No.: US 7,275,137 B2
(45) Date of Patent: Sep. 25, 2007

(54) HANDLING OF THE TRANSMIT ENABLE SIGNAL IN A DYNAMIC RANDOM ACCESS MEMORY CONTROLLER

(75) Inventor: Mark David Bellows, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 10/970,458

(22) Filed: Oct. 21, 2004

(65) Prior Publication Data
US 2006/0090043 A1    Apr. 27, 2006

(51) Int. Cl.
*G06F 12/00* (2006.01)
(52) U.S. Cl. ..................................... 711/154
(58) Field of Classification Search ............... 711/104, 711/110, 154, 169; 710/261; 345/533
See application file for complete search history.

(56) References Cited

U.S. PATENT DOCUMENTS

| | | | | |
|---|---|---|---|---|
| 5,884,067 A | * | 3/1999 | Storm et al. ................ | 345/533 |
| 6,151,658 A | * | 11/2000 | Magro ......................... | 711/110 |
| 6,295,593 B1 | * | 9/2001 | Hsu et al. .................... | 711/169 |
| 6,421,754 B1 | * | 7/2002 | Kau et al. .................... | 710/261 |
| 2006/0123187 A1 | * | 6/2006 | Bellows et al. ............. | 711/104 |

* cited by examiner

*Primary Examiner*—Pierre Bataille
*Assistant Examiner*—Paul Schlie
(74) *Attorney, Agent, or Firm*—Stephen R. Tkacs; Stephen J. Walder, Jr.; D'Ann N. Rifal

(57) ABSTRACT

A method, an apparatus, and a computer program are provided for controlling a transmission enable (TX_ENA) signal. In Extreme Data Rate (XDR™) Dynamic Random Access Memories (DRAMs) or XDRAMS, there is a requirement that a TX_ENA signal remain logic high for a few cycles before data transmission, and, when TX_ENA transitions to logic low, TX_ENA remain logic low for a few cycles. However, maintaining this timing can be difficult with back-to-back writes. Therefore, additional logic is employed within XDRAM memory controllers to insure that TX_ENA does not violate system requirements by allowing TX_ENA to remain logic high between successive writes or when the system is devoid of commands.

11 Claims, 4 Drawing Sheets

HANDLING OF THE TRANSMIT ENABLE SIGNAL IN A DYNAMIC RANDOM ACCESS MEMORY CONTROLLER

FIELD OF THE INVENTION

The present invention relates generally to data transmission control, and more particularly, to data transmission control in a memory controller.

DESCRIPTION OF THE RELATED ART

With Extreme Data Rate (XDR™) DRAMs, available from Rambus, Inc., El Camino Real, Los Altos, Calif. 94022, data rate transfers for memory has been dramatically increased. Such features as an octal data rate, which allows for 8 bits of data transmission per cycle, to allow for such increases in speed. Accordingly, the operation of the XDR™ DRAMs require certain propagation and turn-on times to function. As with any DRAM, and its associated control logic, certain periods of time are between activation and data transmission for either reads or writes. Additionally, some DRAMs can require a certain delay requirements. Specifically, XDR™ DRAMs require a minimum of 2 cycles between transition of the Transmission Enable (TX_ENA) and actual data transmission (TDATA). XDR™ DRAMs also require that if the TX_ENA signal toggles to logic low then TX_ENA should remain logic low for a minimum of 4 cycles. Any deviation from these specifications can result in data error and/or data corruption.

Referring to FIG. 1 of the drawings, the reference numeral 100 generally designates a non-operational write for an XDR™ DRAM. Depicted in FIG. 1 are both TX_ENA signals and TDATA signals.

At $t_0$, both TDATA and TX_ENA are logic low, signifying no data transmission. Then, at $t_1$, TX_ENA transitions to logic high indicating that at some point in the near future that data will be transmitted to the XDR™ DRAM. However, as a result of the design of the XDR™ DRAM, no data can be transmitted before $t_3$. TDATA, though, begins transmitting a first write of data at $t_3$, so there was not a violation. Data is then continually transmitted until $t_7$, where both TDATA and TX_ENA transition to logic low.

In anticipation of a second write of data, TX_ENA transition to logic high again. TDATA is slotted to transmit data at $t_{10}$, at least requiring TX_ENA to transition to logic high at $t_8$ or earlier. However, since TX_ENA has transitioned to logic low at $t_7$ and is forced to transition back to logic high at $t_8$, a problem exists. XDR™ DRAMs require a turn-off time of TX_ENA for a minimum of 4 clock cycles. However, this XDR™ DRAM specification is violated because TX_ENA remains off for only 1 cycle.

Therefore, there is a need for a method and/or apparatus for better controlling TX_ENA signals in anticipation of data transmission that addresses at least some of the problems associated with conventional memory control.

SUMMARY OF THE INVENTION

The present invention provides an apparatus, a method, and a computer program for handling a transmission enxable (TxEna) signal in an XDR memory controller. TxEna logic is employed, where the TxEna logic provides the TxEna signal at least for a predetermined number of cycles and for the duration of a write. However, the provision of TxEna signal can be extended or changed based on circumstances. Specifically, TxEna control logic is employed to provide additional control of the TxEna signal. The TxEna control logic utilizes at least one feedback loop that is at least configured to monitor a sequence of memory commands, and the TxEna control logic instructs the TxEna logic to provide the TxEna signal if there are no memory commands in the sequence.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
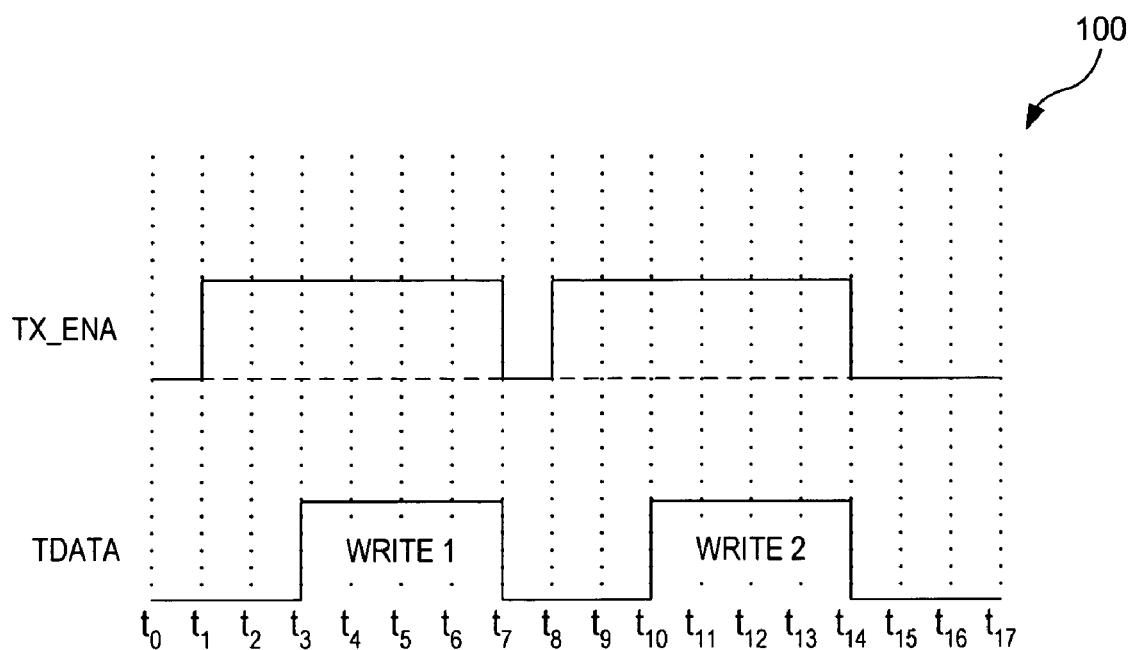
FIG. 1 is a timing diagram depicting a non-operational write.
Figure 2:
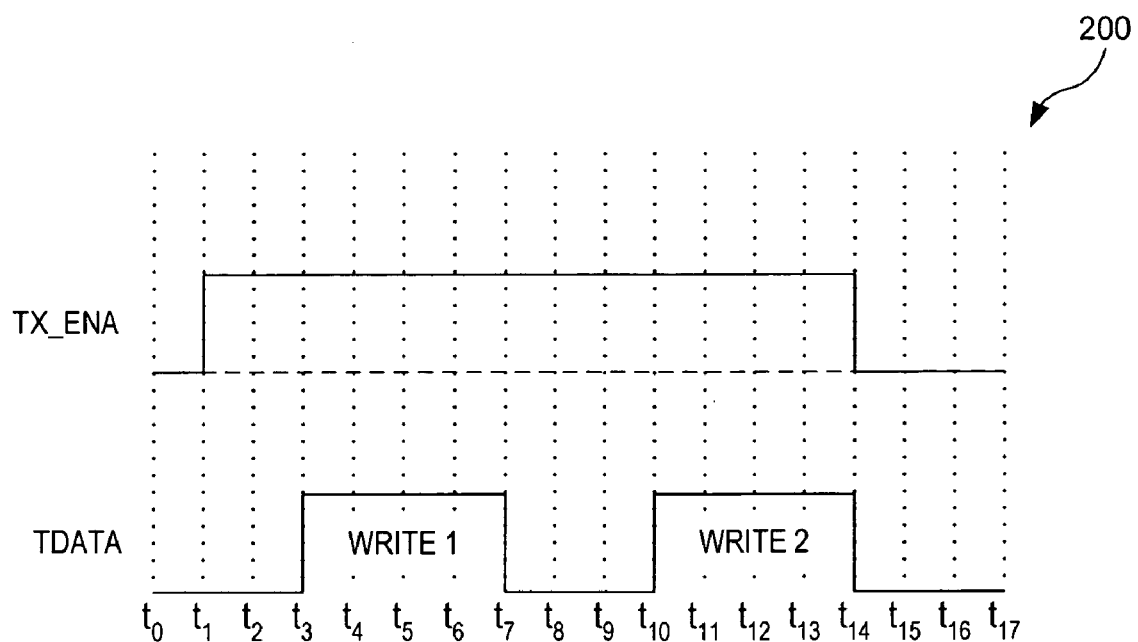
FIG. 2 is a timing chart depicting an operational write.

Referring to FIG. 2 of the drawings, the reference numeral 200 generally designates a timing diagram depicting operational writes for TX_ENA. Depicted in FIG. 1 are both TX_ENA signals and TDATA signals.

At $t_0$, both TDATA and TX_ENA are logic low, signifying no data transmission. Then, at $t_1$, TX_ENA transitions to logic high indicating that at some point in the near future that data will be transmitted to the XDR™ DRAM. However, as a result of the design of the XDR™ DRAM, no data can be transmitted before $t_3$. TDATA, though, begins transmitting a first write of data at $t_3$, so there was not a violation. Data is then continually transmitted until $t_7$, where TDATA transition to logic low.

In anticipation of a second write of data, TX_ENA remains at logic high again. TDATA is slotted to transmit data at $t_{10}$, at least requiring TX_ENA to transition to logic high at $t_8$ or earlier. However, since TX_ENA remains at logic high, data can be safely transmitted. XDR™ DRAMs require a turn-off time of TX_ENA for a minimum of 4 clock cycles, which has been eliminated as a potential barrier.

Figure 3:
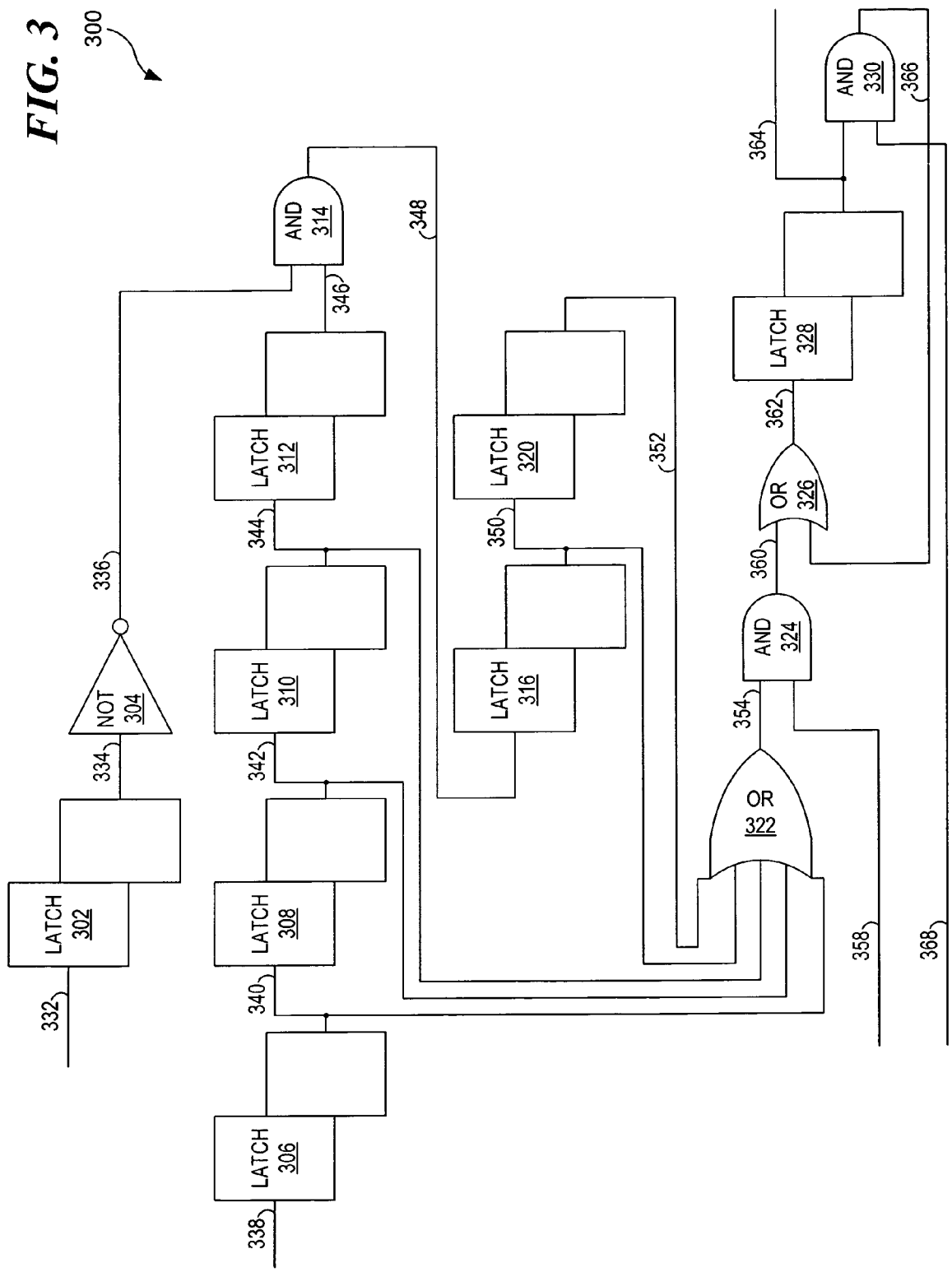
FIG. 3 is a block diagram depicting TX_ENA logic.

To accomplish such a task of anticipating additional future writes, however, additional logic is added. Referring to FIG. 3 of the drawings, the reference numeral 300 generally designates a block diagram depicting TX_ENA logic. The TX_ENA logic 300 comprises eight latches 302, 306, 308, 310, 312, 316, 320, and 328, an inverter 304, three AND gates 314, 324, and 330, and two OR gates 322 and 326.

When initiated, signals are transmitted through communication channels 338 to the latch 306. A start enable signal is transmitted to the latch 306. This initial signal allows for the process to begin whereby TX_ENA can transition to logic high in anticipation of data being written to the DRAMs (not shown).

Once the initial data has been transmitted to the latch 306, the latches 308, 310, and 312 are arranged in a cascade configuration to forward the results of the initial signal. The output of the latch 306 is transmitted to the latch 308 and the OR gate 322 through the communication channel 340. The output of the latch 308 is transmitted to the latch 310 and the OR gate 322 through the communication channel 342. The output of the latch 310 is transmitted to the latch 312 and the OR gate 322 through the communication channel 344. By propagating the initial signal from the communication channel 338, a delay occurs with each propagation. Therefore, the output of the OR gate reflects the result of the initial signal as the signal propagated through the latches The output of the cascaded latches 306, 308, 310, and 312 is the input to the AND gate 314. Specifically, the output of the latch 312 is transmitted to the AND gate 314 through the communication channel 346. In addition to initial signal transmitted to the cascaded latches 306, 308, 310, and 312, a signal can be transmitted to the latch 302, as a register configure signal through communication channel 332. A configuration signal is then output to the inverter 304 through the communication channel 334. The inverted signal is then transmitted to the AND gate 314 through communication channel 336. The result of the ANDed inverted signal and the propagated signal is to allow for TX_ENA to enable the proper registers.

After the initial signals have been propagated and ANDed, another set of cascaded latches is employed. The latches 316 and 320 are arranged in a cascaded fashion such that the output of the AND gate 314 is input into the latch 316. The ANDed signal is transmitted to the latch 316 through the communication channel 348. The latch 316 then propagates the ANDed signal to the the latch 320 and the OR gate 322 through the communication channel 350. The latch 320 the outputs a signal to the OR gate 322 through communication channel 352. Hence, the OR gate reflects the proper TX_ENA for the correct register.

Based on the output of OR gate 322, the TX_ENA transitions to or remains logic high. The OR gate outputs a signal to the AND gate 324 through the communication channel 354. The AND gate 324 ANDs the resultant OR signal with the inverted Drive Complete Enable (DriveCmpEn) that is communicated to the AND gate 324 through the communication channel 358. The DriveCmpEn signal can be overwritten by a state bit so that, when a last enable pulse is received, the mode can be switched from TX_ENA to Compare Enable (CMP_ENA). Therefore, the result from the AND gate 324 can be determinative of the state of the system as to whether TX_ENA is logic high or logic low.

The output of AND gate 324 is then transmitted to a feedback loop. The feedback loop comprises the OR gate 326, the latch 328, and the AND gate 330. The OR gate 326 receives the output of the AND gate 324 through the communication channel 360. The OR gate 326 then feeds the latch 328 through the communication channel 362. The output of the latch 328 is the TX_ENA signal output through the communication channel 364. The TX_ENA signal is then ANDed at the AND gate 330 with a feedback signal transmitted through the communication channel 368. The ANDed output is then fed back to the OR gate 326 through the communication channel 366. Therefore, the TX_ENA signal can be transitioned to logic low based on the logic states of the feedback signal and the output of the AND gate 324 transmitted through the communication channels 368 and 360, respectively.

Figure 4:
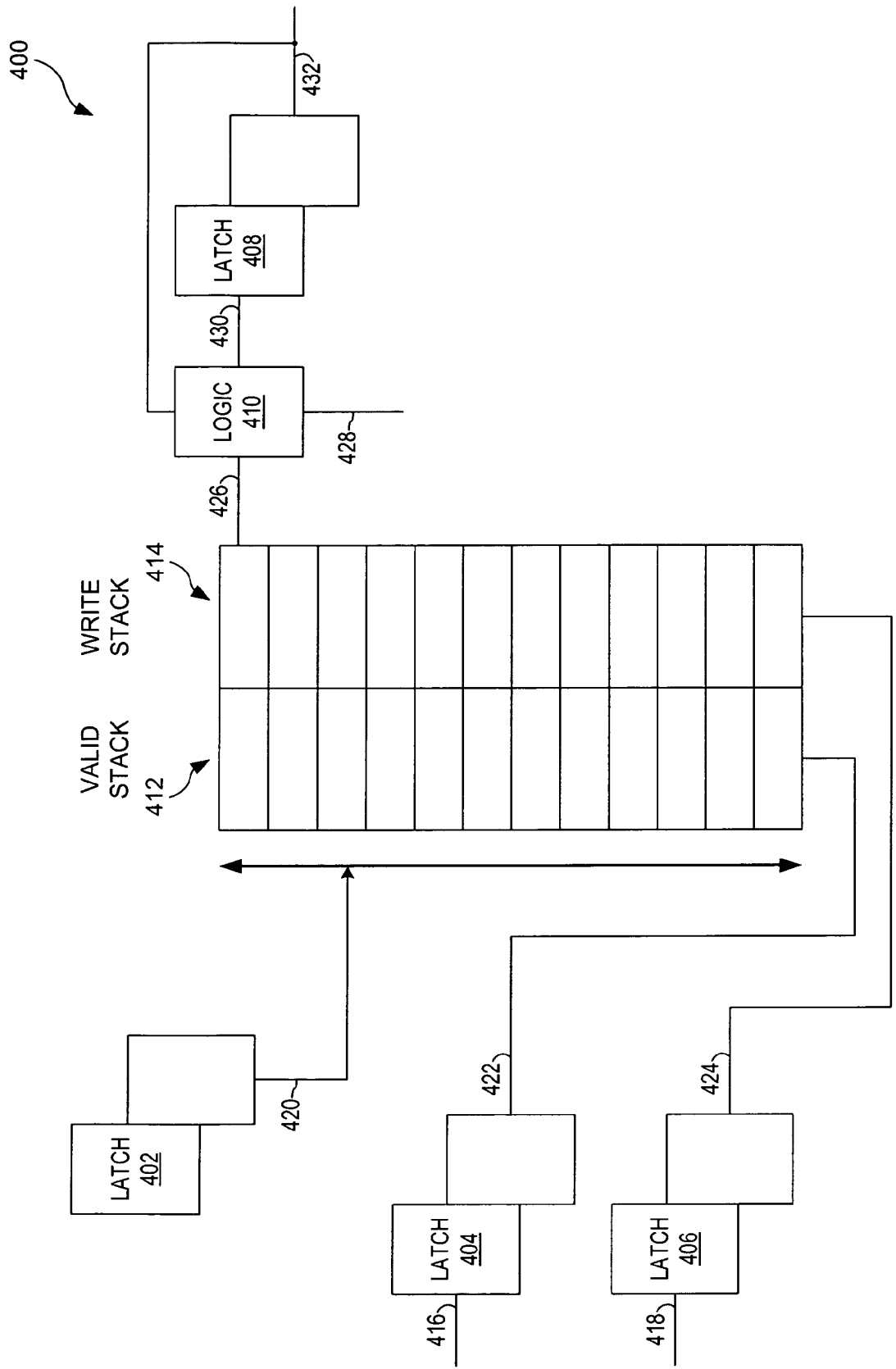
FIG. 4 is a block diagram depicting command logic for the TX_ENA logic.

The feedback signal, then, can be a significant factor in the operation of the TX_ENA logic 300. Referring to FIG. 4 of the drawings, the reference numeral 400 generally designates command logic for the TX_ENA logic. The command logic 400 provides the feedback signal to the communication channel 368. The command logic comprises four latches 402, 404, 406, and 408, control logic 410, a valid queue 412, and a write queue 414.

The command logic 400 receives and stores new command and write entries for execution and provides the enabling output to indicate whether the TX_ENA should be logic high or logic low. New command operations are received at the latch 404 through the communication channel 416. New write data corresponding to each new operation are transmitted to the latch 406 through the communication channel 418. The new operations and new write data are transmitted from the latch 404 and the latch 406 to the valid queue 412 and the write queue 414 through the communications channels 422 and 424, respectively.

At the bottom of the queues 412 and 414 is pointing logic, which is the latch 402. Through the communication channel 420, the latch 402 indicates the next command to be recorded is stored. Effectively, there is no specific pointer, however, as is common with queues.

The control logic 410 then utilizes the available data to generate the feedback signal to the TX_ENA logic 300. Data from the valid queue 412 and the write queue 414 indicating the condition of the respective queues is transmitted to the control logic 410 through the communication channel 426. The control logic 410 also receives a start initialization signal through the communication channel 428, which is equivalent to the communication channel 344 of FIG. 3. In attempting to generate control data, the control signal also employs the DriveCmpEn signal, which is the inverted signal transmitted by the communication channel 358 of FIG. 3. The output of the control logic 410 is then communicated to the latch 408 through the communication channel 430, which then outputs a feedback signal through the communication channel 432. The feedback signal is transmitted to the control logic 410 as well as to the logic gate 330 of FIG. 3 because the communication channel 432 is equivalent to the communication channel 368 of FIG. 3.

Under certain conditions, the control logic 410 provides the control data necessary to generate a logic high TX_ENA signal. To provide such a signal, the start initialization signal is '1' or logic high, and the DriveCmpEn is '0' or logic low. Also, the value from the valid queue 412 is '1,' while the value from the write queue 414 is '1.' Under other conditions, though, where the value from the valid queue 412 is '1' and the value from the write queue 414 is '0,' the feedback loop will be terminated. Essentially, the queues 412 and 414 are received. In other words, when the value from the valid queue 412 is '1' and the value from the write queue 414 is '0,' a read operation is the commanded operation that requires TX_ENA to transition to logic low.

Therefore, the valid queue 412 and the write queue 414 assist in preventing the hardware from violating the predetermined criteria. Effectively, as soon as a read, a write, or a calibration event occurs, the event is logged in the queues 412 and 414. However, only a write will enable a logic high or '1' output value for the write queue 414, while the remaining event types will reflect a logic low or '0.' When a write reaches the top of the queues 412 and 414 and is executed, the feedback path is left open. Additionally, the TX_ENA is driven for 6 cycles from the latches 306, 308, 310, 312, 316, and 320 of FIG. 3 and until something kills the feedback loop.

Figure 5:
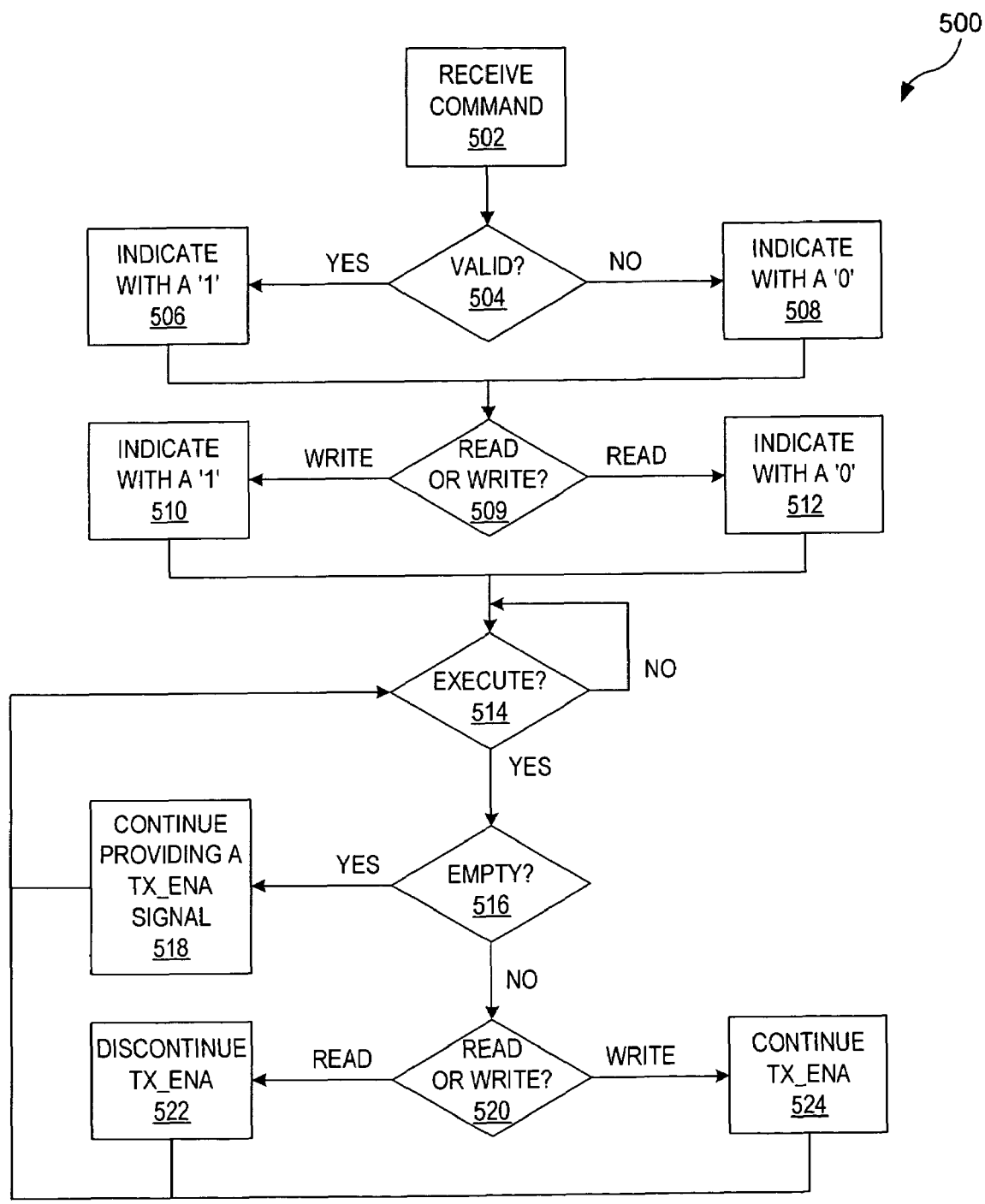
FIG. 5 is a flow chart depicting the operation of the TX_ENA logic and the TX_ENA command logic.

The TX_ENA logic 300 and the TX_ENA control logic 400 do, however, operate in conjunction to provide cohesive control of the TX_ENA signal. Referring to FIG. 5 of the drawings, the reference numeral 500 generally designates a flow chart depicting the operation of the TX_ENA logic 300 and the TX_ENA control logic 400.

Initially, commands are issued to XDRAMs. When a command is received in step 502, an analysis of the commands begins. A determination is made in step 504 as to whether the command is valid or invalid. If the command is valid, then in step 506 a '1' is written into the valid queue 414. However, if the command is not valid, then in step 508 a '0' is written into the valid queue 414. Once the validity has been determined, then in step 509 the command is analyzed to determine whether it is a read or a write command. If the command is a write command, then in step 510 a '1' is written into the write queue 414. Also, if the command is a read command, then in step 512 a '0' is written into the write queue 414.

After commands have been accounted for in the queues 412 and 414, the system waits for execution in step 514. A determination is then made in step 516 as to whether the queues are empty. If the queues are empty, then in step 514 the system 300 and 400 continues to provide a TX_ENA signal and waits for another execution. Otherwise, a determination is made in step 520 as to whether the command at the top of the queue is a read command or a write command. If the command is a read command, the TX_ENA signal is discontinued in step 522, but if the command is a write command, then the TX_ENA signal is continued in step 524. After execution is complete of either a read or write signal, the system 300 and 400 waits for another execution in step 514.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus for handling a transmit enable signal in a memory controller, comprising:

transmit enable logic that is configured to assert the transmit enable signal at least for a first predetermined number of cycles greater than one and for the duration of a write; and control logic that provides a feedback signal to the transmit enable logic, wherein the control logic provides the feedback signal to the transmit enable logic by:

generating at least one queue of bits to track the sequence of memory commands;

asserting the feedback signal if the at least one queue is empty;

if an entry at a top of the at least one queue indicates a valid write command, asserting the feedback signal and removing the entry from the at least one queue; and if the entry at the top of the at least one queue does not indicate a valid write command, deasserting the feedback signal and removing the entry from the at least one queue;

wherein the transmit enable logic has at least one feedback loop, and wherein the transmit enable logic is configured to receive the feedback signal in the at least one feedback loop and to keep the transmit enable signal asserted after the first predetermined number of cycles if the feedback signal is asserted and to deassert the transmit enable signal for a second predetermined number of cycles greater than one if the feedback signal is deasserted.

2. The apparatus of claim 1, wherein the transmit enable logic further comprises a plurality of latches to provide the transmit enable signal for the predetermined number of cycles.

3. The apparatus of claim 1, wherein the at least one feedback loop further comprises feedback control logic that is configured to terminate the at least one feedback loop if a next command in the sequence indicates a read command.

4. The apparatus of claim 1, wherein the at least one queue further comprises:

a valid bit queue to indicate the validity of memory commands within the sequence; and a write bit queue to indicate whether the memory commands within the sequence are read command or are write commands.

5. The apparatus of claim 4, wherein the at least one feedback loop further comprises feedback control logic that is configured to terminate the at least one feedback loop if a next command in the sequence indicates a read command with '0' in the write bit queue.

6. A method for providing a transmit enable signal in a memory controller, the method comprising:

asserting, in transmit enable logic, a transmit enable signal for a first predetermined number of cycles greater than one;

providing, in control logic, a feedback signal based on a sequence of memory commands, comprising:

generating a queue of bits to track the sequence of memory commands;

asserting the feedback signal if the queue is empty;

if an entry at a top of the queue indicates a valid write command, asserting the feedback signal and removing the entry from the queue; and if the entry at the top of the queue does not indicate a valid write command, deasserting the feedback signal and removing the entry from the queue;

receiving the feedback signal in the transmit enable logic;

keeping the transmit enable signal asserted after the first predetermined number of cycles if the feedback signal is asserted; and deasserting, in the transmit enable logic, the transmit enable signal responsive to a non-write memory command and the feedback signal being deasserted for a second predetermined numbers of cycles greater than one.

7. The method of claim 6, wherein generating a queue of bits further comprises:

generating a valid queue of valid bits to indicate validity of the commands in the sequence; and generating a write queue of write bits to indicate whether the commands in the sequence are either a read command or a write command.

8. The method of claim 7, wherein the method further comprises determining if a next command in the sequence is a read command or a write command.

9. The method of claim 8, wherein determining if a next command in the sequence is a read command or a write command further comprises determining that the next command is a write command if a value of the top of the valid queue is '1' and a value of the top of the write queue is '1'.

10. The method of claim 8, wherein determining if a next command in the sequence is a read command or a write command further comprises indicating that the next command is a read command if a value of the top of the valid queue is '1' and a value of the top of the write queue is '0'.

11. The method of claim 6, wherein asserting the transmit enable signal for a predetermined number of cycles further comprises latching the transmit enable signal for the predetermined number of cycles.

* * * * *